US012356866B2

United States Patent
Oikawa et al.

(10) Patent No.: US 12,356,866 B2
(45) Date of Patent: Jul. 8, 2025

(54) MAGNETIC MEMORY DEVICE

(71) Applicants: Kioxia Corporation, Tokyo (JP); SK hynix Inc., Icheon-si (KR)

(72) Inventors: Tadaaki Oikawa, Seoul (KR); Youngmin Eeh, Seongnam-si (KR); Eiji Kitagawa, Seoul (KR); Kazuya Sawada, Seoul (KR); Taiga Isoda, Seoul (KR); Ku Youl Jung, Icheon-si (KR); Jin Won Jung, Icheon-si (KR)

(73) Assignees: Kioxia Corporation, Tokyo (JP); SK hynix Inc., Gyeonggi-Do (KR)

( * ) Notice: Subject to any disclaimer, the term of this patent is extended or adjusted under 35 U.S.C. 154(b) by 641 days.

(21) Appl. No.: 17/472,056

(22) Filed: Sep. 10, 2021

(65) Prior Publication Data
US 2022/0302372 A1 Sep. 22, 2022

(30) Foreign Application Priority Data
Mar. 17, 2021 (JP) .................. 2021-043842

(51) Int. Cl.
*H01L 43/02* (2006.01)
*H10B 61/00* (2023.01)
*H10N 50/80* (2023.01)
*H10N 50/85* (2023.01)

(52) U.S. Cl.
CPC .............. *H10N 50/80* (2023.02); *H10B 61/20* (2023.02); *H10N 50/85* (2023.02)

(58) Field of Classification Search
CPC ................................ H10N 50/80; H10N 50/85
USPC ....................................................... 257/421
See application file for complete search history.

(56) References Cited

U.S. PATENT DOCUMENTS

| | | | |
|---|---|---|---|
| 8,841,139 B2 | 9/2014 | Kamata et al. | |
| 8,995,181 B2 | 3/2015 | Watanabe et al. | |
| 9,130,143 B2 | 9/2015 | Nagase et al. | |
| 9,142,756 B2 | 9/2015 | Nagamine et al. | |
| 9,178,137 B2 | 11/2015 | Eeh et al. | |
| 9,184,374 B2 | 11/2015 | Sawada et al. | |
| 9,209,386 B2 | 12/2015 | Nagamine et al. | |
| 9,252,357 B2 | 2/2016 | Watanabe et al. | |
| 9,269,890 B2 | 2/2016 | Nakayama et al. | |
| 9,293,695 B2 | 3/2016 | Ueda et al. | |
| 9,461,240 B2 | 10/2016 | Sawada et al. | |

(Continued)

FOREIGN PATENT DOCUMENTS

JP 5480321 B2 4/2014

OTHER PUBLICATIONS

U.S. Appl. No. 17/016,230, First Named Inventor: Kazuya Sawada; Title: "Magnetic Memory Device"; Filed: Sep. 9, 2020.

(Continued)

*Primary Examiner* — Dzung Tran
(74) *Attorney, Agent, or Firm* — Holtz, Holtz & Volek PC

(57) ABSTRACT

According to one embodiment, a magnetic memory device includes a stacked structure including a first magnetic layer having a variable magnetization direction, a second magnetic layer having a fixed magnetization direction, a non-magnetic layer provided between the first magnetic layer and the second magnetic layer, and an oxide layer provided adjacent to the first magnetic layer, the first magnetic layer being provided between the non-magnetic layer and the oxide layer, and the oxide layer containing a rare earth element, boron (B), and oxygen (O).

11 Claims, 5 Drawing Sheets

(56) References Cited

U.S. PATENT DOCUMENTS

| | | | |
|---|---|---|---|
| 9,466,350 B2 | 10/2016 | Murayama et al. | |
| 9,608,199 B1 | 3/2017 | Kitagawa | |
| 9,620,561 B2 | 4/2017 | Nagase et al. | |
| 9,640,584 B2 | 5/2017 | Nagamine et al. | |
| 9,640,755 B2 | 5/2017 | Lee et al. | |
| 9,647,203 B2 | 5/2017 | Kitagawa et al. | |
| 9,705,076 B2 | 7/2017 | Nagamine et al. | |
| 9,741,928 B2 | 8/2017 | Ueda et al. | |
| 9,947,862 B2 | 4/2018 | Watanabe et al. | |
| 9,991,313 B2 | 6/2018 | Watanabe et al. | |
| 10,026,888 B2 | 7/2018 | Ochiai et al. | |
| 10,026,891 B2 | 7/2018 | Nagase et al. | |
| 10,090,459 B2 | 10/2018 | Watanabe et al. | |
| 10,103,318 B2 | 10/2018 | Watanabe et al. | |
| 10,170,519 B2 | 1/2019 | Eeh et al. | |
| 10,199,568 B2 | 2/2019 | Nagamine et al. | |
| 10,211,256 B2 | 2/2019 | Kitagawa | |
| 10,263,178 B2 | 4/2019 | Sawada et al. | |
| 10,305,027 B2 | 5/2019 | Kato et al. | |
| 10,325,640 B2 | 6/2019 | Kishi et al. | |
| 10,388,343 B2 | 8/2019 | Oikawa et al. | |
| 10,468,170 B2 | 11/2019 | Eeh et al. | |
| 10,490,732 B2 | 11/2019 | Sonoda et al. | |
| 10,510,950 B2 | 12/2019 | Watanabe et al. | |
| 10,840,434 B2 | 11/2020 | Kitagawa et al. | |
| 10,873,021 B2 | 12/2020 | Eeh et al. | |
| 10,910,032 B2 | 2/2021 | Kishi et al. | |
| 11,127,445 B2 | 9/2021 | Eeh et al. | |
| 2006/0128547 A1* | 6/2006 | Takada | C03C 10/00 501/50 |
| 2011/0044096 A1* | 2/2011 | Li | H01L 21/67011 365/158 |
| 2013/0307097 A1* | 11/2013 | Yi | H10N 50/10 257/E29.323 |
| 2014/0011298 A1* | 1/2014 | Li | G11C 11/16 438/3 |
| 2014/0038312 A1* | 2/2014 | Lee | H10N 50/10 438/3 |
| 2014/0284534 A1 | 9/2014 | Nagase et al. | |
| 2014/0284733 A1 | 9/2014 | Watanabe et al. | |
| 2015/0068887 A1 | 3/2015 | Nagamine et al. | |
| 2015/0069544 A1 | 3/2015 | Nagamine et al. | |
| 2015/0069554 A1 | 3/2015 | Nakayama et al. | |
| 2015/0076485 A1* | 3/2015 | Sandhu | H10N 50/10 257/43 |
| 2015/0179926 A1* | 6/2015 | Watanabe | H10N 50/10 257/421 |
| 2015/0259788 A1 | 9/2015 | Nagamine et al. | |
| 2016/0099408 A1 | 4/2016 | Nagamine et al. | |
| 2016/0130693 A1 | 5/2016 | Sawada et al. | |
| 2016/0260773 A1 | 9/2016 | Kitagawa et al. | |
| 2016/0268501 A1 | 9/2016 | Kitagawa | |
| 2017/0263678 A1 | 9/2017 | Kitagawa | |
| 2017/0263679 A1 | 9/2017 | Ozeki et al. | |
| 2017/0263680 A1 | 9/2017 | Yoshino et al. | |
| 2018/0076262 A1 | 3/2018 | Eeh et al. | |
| 2018/0205006 A1 | 7/2018 | Watanabe et al. | |
| 2018/0269043 A1 | 9/2018 | Ueda et al. | |
| 2018/0277745 A1 | 9/2018 | Oikawa et al. | |
| 2018/0309048 A1 | 10/2018 | Ochiai et al. | |
| 2019/0019841 A1 | 1/2019 | Eeh et al. | |
| 2019/0088855 A1 | 3/2019 | Yamakawa et al. | |
| 2019/0296226 A1* | 9/2019 | Eeh | H10N 50/85 |
| 2019/0305217 A1 | 10/2019 | Xue et al. | |
| 2020/0075671 A1 | 3/2020 | Ozeki et al. | |
| 2020/0294567 A1 | 9/2020 | Oikawa et al. | |
| 2020/0302987 A1 | 9/2020 | Sawada et al. | |
| 2021/0074908 A1 | 3/2021 | Oikawa et al. | |
| 2021/0074911 A1 | 3/2021 | Isoda et al. | |
| 2021/0083170 A1 | 3/2021 | Sawada et al. | |

OTHER PUBLICATIONS

U.S. Appl. No. 17/016,256, First Named Inventor: Taiga Isoda; Title: "Memory Device"; Filed: Sep. 9, 2020.

U.S. Appl. No. 17/016,272, First Named Inventor: Hisanori Aikawa; Title: "Semiconductor Memory Device and Memory System"; Filed: Sep. 9, 2020.

U.S. Appl. No. 17/199,593, First Named Inventor: Kenichi Yoshino; Title: "Magnetic Memory Device and Method for Manufacturing the Same"; Filed: Mar. 12, 2021.

U.S. Appl. No. 17/389,399, First Named Inventor: Taiga Isoda; Title: "Magnetoresistance Memory Device"; Filed: Jul. 30, 2021.

U.S. Appl. No. 17/471,327, First Named Inventor: Takao Ochiai; Title: "Magnetoresistance Memory Device and Method of Manufacturing Magnetoresistance Memory Device"; Filed: Sep. 10, 2021.

U.S. Appl. No. 17/471,340, First Named Inventor: Kazuya Sawada; Title: "Magnetic Memory Device"; Filed: Sep. 10, 2021.

U.S. Appl. No. 17/472,131, First Named Inventor: Eiji Kitagawa; Title: "Magnetic Memory Device"; Filed: Sep. 10, 2021.

U.S. Appl. No. 17/472,472, First Named Inventor: Tadaaki Oikawa; Title: "Magnetic Memory Device"; Filed: Sep. 10, 2021.

* cited by examiner

MAGNETIC MEMORY DEVICE

CROSS-REFERENCE TO RELATED APPLICATIONS

This application is based upon and claims the benefit of priority from Japanese Patent Application No. 2021-043842, filed Mar. 17, 2021, the entire contents of which are incorporated herein by reference.

FIELD

Embodiments described herein relate generally to a magnetic memory device.

BACKGROUND

A nonvolatile magnetic memory device in which a plurality of magnetoresistance effect elements are integrated on a semiconductor substrate, has been proposed.

DETAILED DESCRIPTION

In general, according to one embodiment, a magnetic memory device includes a stacked structure including: a first magnetic layer having a variable magnetization direction; a second magnetic layer having a fixed magnetization direction; a non-magnetic layer provided between the first magnetic layer and the second magnetic layer; and an oxide layer provided adjacent to the first magnetic layer, the first magnetic layer being provided between the non-magnetic layer and the oxide layer, and the oxide layer containing a rare earth element, boron (B), and oxygen (O).

Embodiments will be described hereinafter with reference to the accompanying drawings.

Embodiment 1

Figure 1:
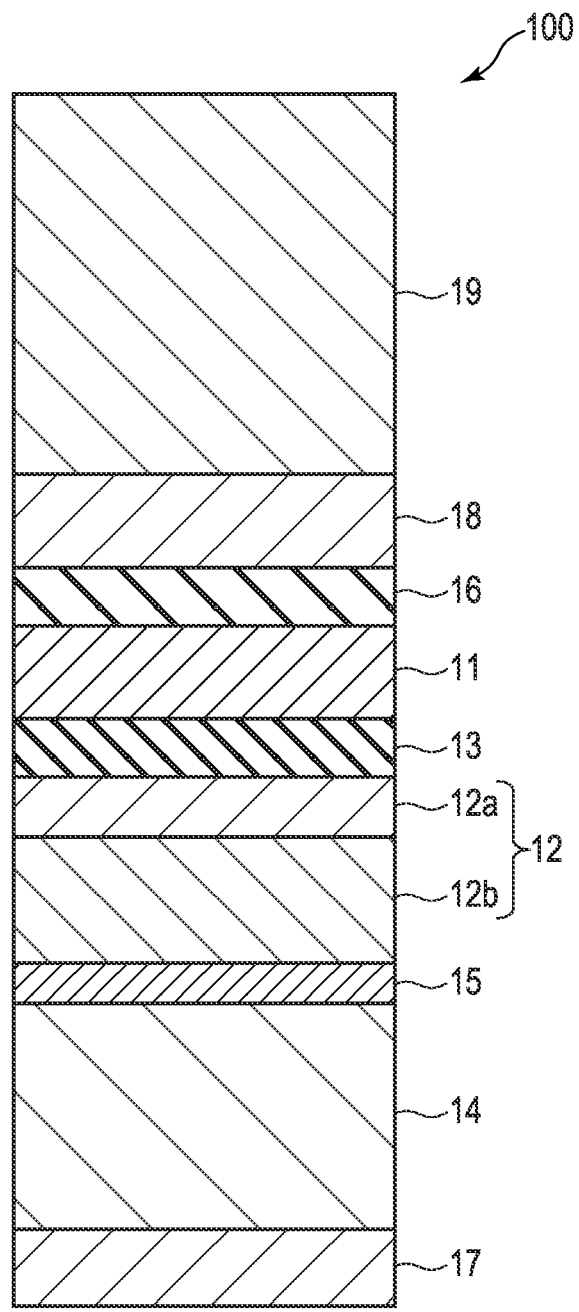
FIG. 1 is a cross-sectional view schematically showing a configuration of a stacked structure of a magnetoresistance effect, element contained in a magnetic memory device according to the first embodiment.

FIG. 1 is a cross-sectional view schematically showing the configuration of a stacked structure of a magnetoresistance effect element contained in a magnetic memory device according to the first embodiment. As the magnetoresistance effect element, a magnetic tunnel junction (MTJ) element is used.

A stacked structure 100 includes a storage layer (first magnetic layer) 11, a reference layer (second magnetic layer) 12, a tunnel barrier layer (nonmagnetic layer) 13, a shift-canceling layer (third magnetic layer) 14, a spacer layer 15, an oxide layer 16, a buffer layer 17, a top layer 18, and an upper cap layer 19.

The storage layer (first magnetic layer) 11 is a ferromagnetic layer having a variable magnetization direction. The variable magnetization direction means that the magnetization direction varies with respect to a predetermined write current. The storage layer 11 is formed of an FeCoB layer containing iron (Fe), cobalt (Co) and boron (B).

The reference layer (second magnetic layer) 12 is a ferromagnetic layer having a fixed magnetization direction. The fixed magnetization direction means that the magnetization direction does not vary with respect to a predetermined write current. The reference layer 12 includes a first, layer portion 12a and a second layer portion 12b. The first layer portion 12a is formed of an FeCoB layer containing iron (Fe), cobalt (Co) and boron (B). The second layer portion 12b contains cobalt (Co) and at least one element selected from platinum (Ft), nickel (Ni) and palladium (Pd).

The tunnel barrier layer (non-magnetic layer) 13 is an insulating layer, provided between the storage layer 11 and the reference layer 12. The tunnel barrier layer 13 is formed of an MgO layer containing magnesium (Mg) and oxygen (O).

The shift-canceling layer (third magnetic layer) 14 is a ferromagnetic layer having a fixed magnetization direction antiparallel to the magnetization direction of the reference layer 12, and has the function of canceling a magnetic field applied from the reference layer 12 to the storage layer 11. The shift-canceling layer 14 contains cobalt (Co) and at least one element selected from platinum (Pt), nickel (Ni) and palladium (Pd).

The spacer layer 15 is provided between the reference layer 12 and the shift-canceling layer 14, and the spacer layer 15 antiferromagnetically couples the reference layer 12 and the shift-canceling layer 14 with each other. That is, the reference layer 12, the shift-canceling layer 14 and the spacer layer 15 form a synthetic anti-ferromagnetic (SAF) structure. The spacer layer 15 is formed of a ruthenium (Ru) layer or an iridium (Ir) layer.

The oxide layer 16 is provided adjacent to the storage layer 11, and the storage layer 11 is provided between the tunnel barrier layer 13 and the oxide layer 16. More specifically, the oxide layer 16 is provided on the upper layer side of the storage layer 11 and is in contact with the storage layer 11. The oxide layer 16 contains a rare earth element (gadolinium (Gd), scandium (Sc), yttrium (Y) and the like), boron (B) and oxygen (O). The oxide layer 16 also functions as a cap layer.

The buffer layer 17 is provided on the lower layer side of the shift-canceling layer 14 and is formed of a predetermined conductive material.

The top layer 19 is provided on the upper layer side of the oxide layer. 16 and is formed of a predetermined conductive material such as ruthenium (Ru) or tantalum (Ta).

The upper cap layer 19 is provided on the upper layer side of the top layer 13 and is formed of a predetermined conductive material.

The magnetoresistance effect element constituted by the above-described stacked structure 100 is a spin transfer torque (STT) type magnetoresistance effect element having perpendicular magnetization. That is, the magnetization directions of the storage layer 11, the reference layer 12 and the shift-Canceling layer 11 are perpendicular to their respective film surfaces.

When the magnetisation direction of the storage layer 31 is parallel to the magnetization direction of the reference layer 12, the magnetoresistance effect element is in a relatively low-resistance state, whereas when the magnetization direction of the storage layer 31 is anti-parallel to the magnetization direction of the reference layer 12, the magnetoresistance effect element is in a relatively high-resistance state. Therefore, the magnetoresistance effect element can store binary data according to the resistance state of the magnetoresistance effect element, further, the magnetoresistance effect, element can be set to a low resistance state or a high resistance state according to the direction of the current flowing in the magnetoresistance effect element.

As described above, in this embodiment, the oxide layer 16 containing a rare earth element, boron (B) and oxygen (O) is provided adjacent to the storage layer 11. With this configuration, it is possible to obtain a magnetoresistance effect element having excellent characteristics, as described below.

In general, in order to improve the write error rate (WER) and ballooning of a magnetoresistance effect element, it is effective to reduce the product of the saturation magnetization Ms of the storage layer and the thickness t of the storage layer, Mst of the storage layer. The ballooning means a write error which is generated in such a manner that a domain is generated in the storage layer during a write operation, thereby being stabilized due to a closed magnetic circuit, and thus magnetization reversal is inhibited. But, when the thickness of the storage layer is reduced to a certain level or less, agglomeration of particles in the storage layer occurs. As a result, the wettability of the interface of the storage layer is deteriorated and the surface roughness is increased. Due to the agglomeration of the storage layer, it is difficult to reduce the thickness t of the storage layer.

Under these circumstances, in order to reduce the Mst of the storage layer, a boron (B)-rich storage layer or a storage layer with a non-magnetic element such as molybdenum (Mo) added thereto is often used. In this case, however, such problems arises as an increase in write current Ic and a decrease in thermal stability Δ.

Therefore, it is important to reduce the Mst of the storage layer, while suppressing the increase in write current Ic and the decrease in thermal stability Δ.

In this embodiment, as described above, the oxide layer 16 contains a rare earth element and boron. The oxide layer 16 containing a rare earth element can increase the perpendicular magnetic anisotropy of the storage layer 11. Further, the oxide layer 16 containing boron can improve the wettability between the storage layer 11 and the oxide layer 16 functioning as a cap layer, thus making it possible to reduce the thickness t of the storage layer 11 while suppressing agglomeration. For these reasons, in this embodiment, it is possible to lower the Mst of the storage layer 11 while suppressing the increase in write current Ic and the decrease in thermal stability Δ.

Figure 2:
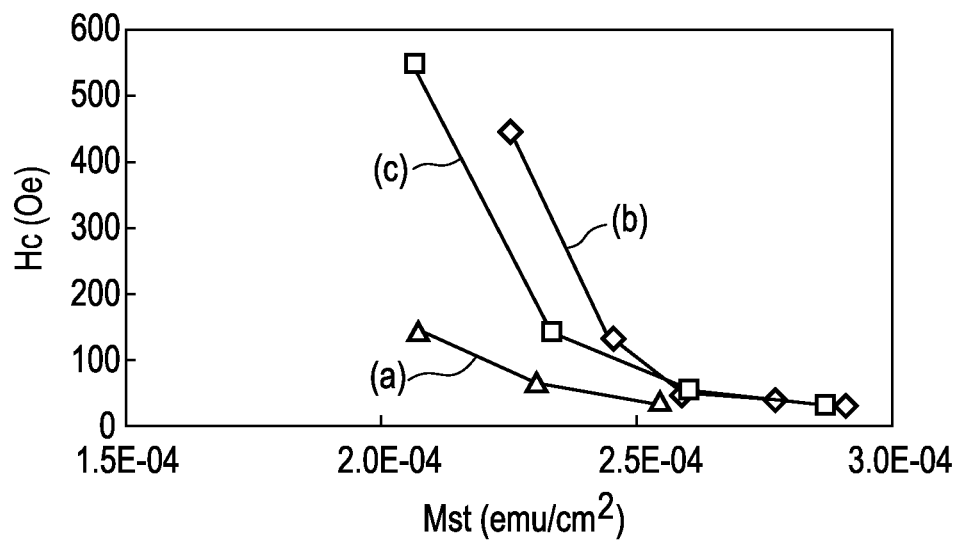
FIG. 2 is a diagram illustrating an effect of improving characteristics of the magnetoresistance effect element according to the first embodiment.
Figure 3:
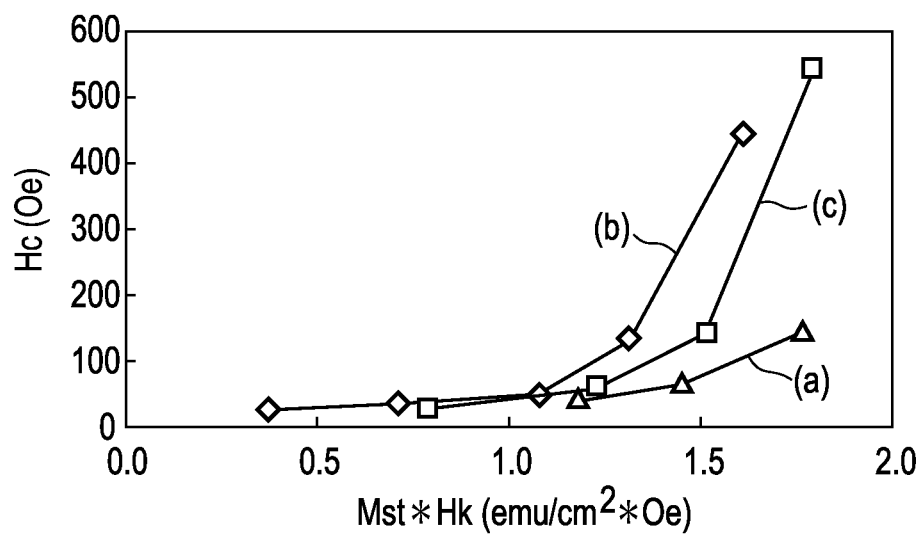
FIG. 3 is a diagram illustrating an effect of improving characteristics of the magnetoresistance effect element, according to the first embodiment.

FIGS. 2 and 3 are diagrams each illustrating the effect of improving the characteristics of the magnetoresistance effect element of the present embodiment.

Note that in FIG. 2, the horizontal axis indicates Mst of the storage layer 11, and the vertical axis indicates the coercive force (Hc) of the storage layer 11. In FIG. 3, the horizontal axis indicates the product of Mst of the storage layer 11 and anisotropic magnetic field Hk (which corresponding to thermal stability Δ), whereas the vertical axis indicates the coercive force Hc of the storage layer 11. The coercive force Hc is a parameter that increases or decreases in response to the generation of defects in the storage layer and the increase in roughness, which are caused by the generation of agglomeration. As the agglomeration progresses by thinning of the storage layer, the coercive force Hc also increases monotonically. Therefore, in order to lower the Mst of the storage layer, it is important to suppress the increase in coercive force Hc (to suppress the agglomeration).

In FIGS. 2 and 3, characteristic line (a) represents the case where the oxide layer of this embodiment (the oxide layer containing a rare earth element and boron) is used, characteristic line (b) represents the case where an oxide layer of the first comparative example (an oxide layer containing a rare earth element and no boron) is used, and characteristic line (c) represents the case where an oxide layer of the second comparative example art oxide layer containing hafnium (Hf) is used. Note that the oxide-layer of this embodiment contains gadolinium (Gd) as the rare earth element.

As can be seen from FIGS. 2 and 3, the coercive force Hc of this embodiment is reduced compared to those of the first and second comparative examples. Thus, with use of the oxide layer of this embodiment, it is possible to obtain the characteristic improvement effect described above.

As described above, in this embodiment, the oxide layer 16 containing a rare earth element, boron (B) and oxygen (O) is provided adjacent to the storage layer 12. With this structure, the Mst of the storage layer can be lowered while suppressing the increase in write current Ic and the decrease in thermal stability Δ, thereby making it possible to improve the WER and Ballooning of the magnetoresistance effect device.

Figure 4:
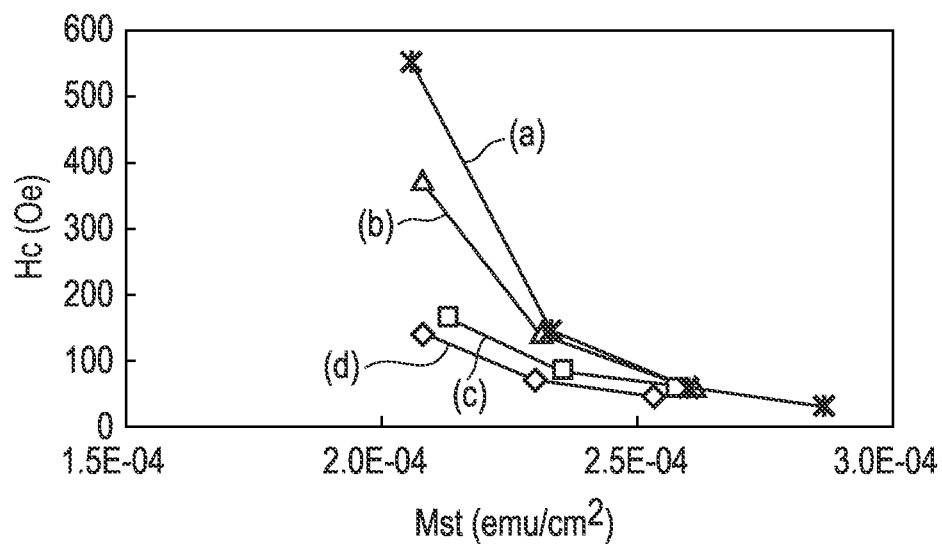
FIG. 4 is a diagram showing the characteristics of the magnetoresistance effect element when the ratio of the concentration of boron (B) to the total concentration of rare earth elements and boron (B) in the oxide layer is varied in the magnetoresistance effect element of the first embodiment.
Figure 5:
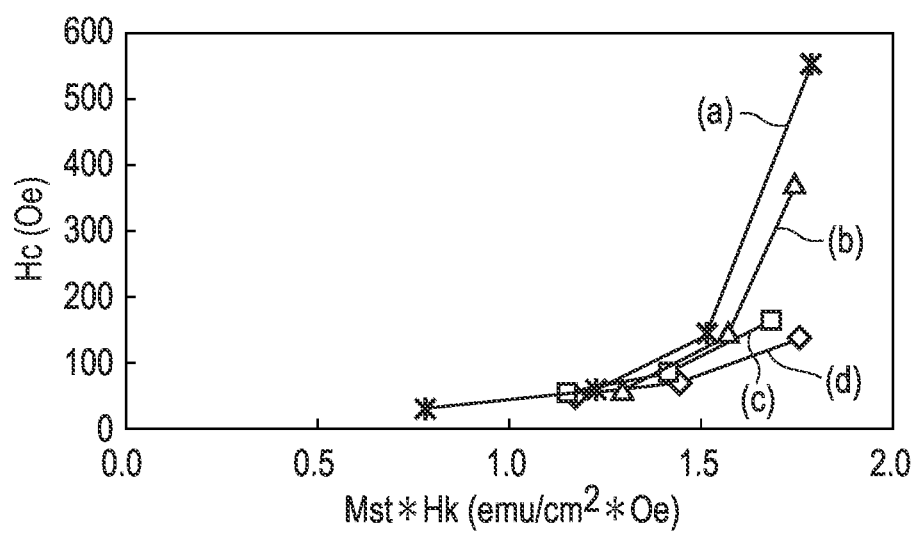
FIG. 5 is a diagram showing the characteristics of the magnetoresistance effect element when the ratio of the concentration of boron (B) to the total concentration of rare earth elements and boron (B) in the oxide layer is varied in the magnetoresistance effect element of the first embodiment.

FIGS. 4 and 5 are diagrams each illustrating the characteristics of the oxide layer of this embodiment (an oxide layer containing a rare earth element and boron) when the ratio R of the concentration of boron to the total concentration of the rare earth element and boron is varied.

In FIG. 4, the horizontal axis indicates the Mst of the storage layer 11, and the vertical axis indicates the coercive force Hc of the storage layer 11. In FIG. 5, the horizontal axis indicates the product of Mst of the storage layer 11 and the anisotropic magnetic field Hk (which corresponds to thermal stability Δ), and the vertical axis indicates the coercive force Hc of the storage layer 11.

In FIGS. 4 and 5, line (a) indicates the case of R=0%, line (b) indicates the case of R=10%, line (c) indicates the case of P=20%, and line (d) indicates the case of R=50%. In all cases of (a), (b), (c) and (d), the oxide layer contains gadolinium (Gd) as a rare earth element.

As shown in FIGS. 4 and 5, the coercive force Hc is reduced in (c) and (d) as compared to the cases (a) and (b). Between the cases (c) and (d), no significant difference in coercive force Hc was observed, from these results, it is considered that when the ratio R is 20% or higher, a wettability sufficient to suppress the formation of agglomerations can be obtained at the interface between the storage layer and the oxide layer, and similar advantageous effects as those of FIGS. 2 and 3 described above can be obtained. Therefore, the ratio R of the concentration of boron to the total concentration of the rare earth element and boron should preferably be 20% or higher.

Embodiment 2

Figure 6:
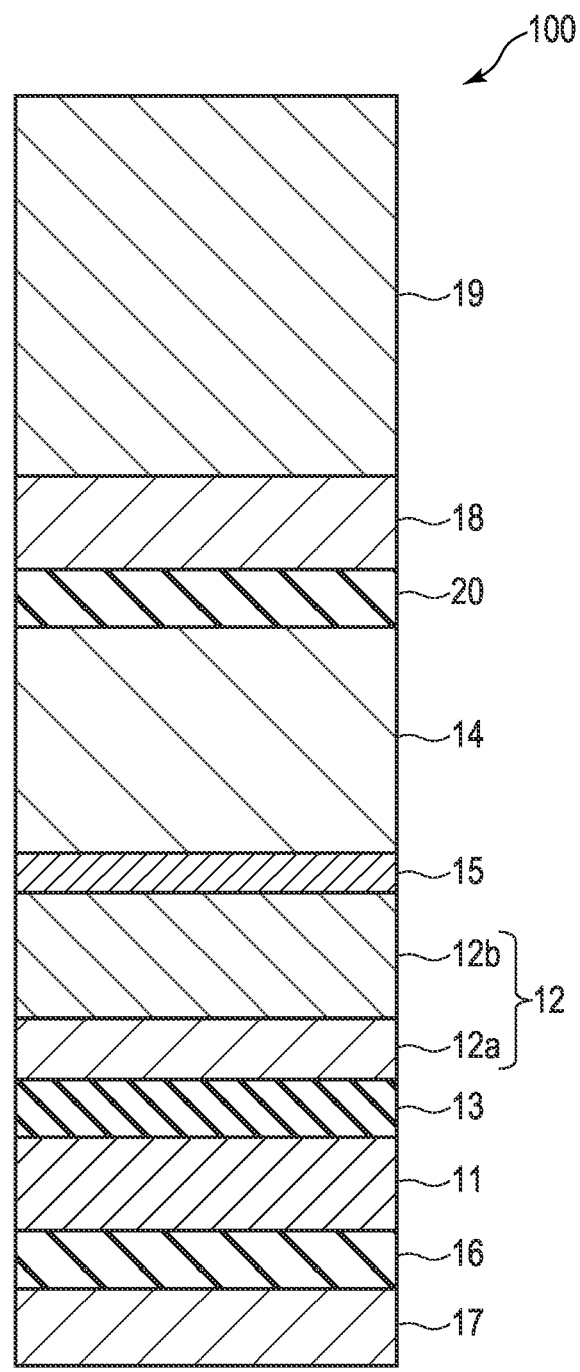
FIG. 6 is a cross-sectional view schematically showing a configuration of a stacked structure of a magnetoresistance effect element contained in a magnetic memory device according to the second embodiment.

FIG. 6 is a cross-sectional view schematically showing a configuration of a stacked structure of a magnetoresistance effect element contained in the magnetic memory device of the second embodiment. The basic items are similar to these of the first embodiment, and the description of the items already-explained in the first embodiment will be omitted.

In the first embodiment, the top-free magnetoresistance effect element in which the storage layer 11 is located on the upper layer side of the reference layer 12 is used, whereas, in this embodiment, a bottom-free magnetoresistance effect element in which the storage layer 11 is located on the lower layer side of the reference layer 12 is used.

In this embodiment as well, the oxide layer 16 is provided adjacent to the storage layer 11, and the storage layer 11 is provided between the tunnel barrier layer 13 and the oxide layer 16 as in the first embodiment. More specifically, the oxide layer 16 is provided on the lower layer side of the storage layer 11 and is in contact with the storage layer 11. Further, as in the first embodiment, the oxide layer 16 contains a rare earth element (gadolinium (Gd), scandium (Sc), yttrium (Y) or the like), boron (B) and oxygen (O).

Further, a shift-canceling layer 14 is provided on the upper layer side of the reference layer 12, and a cap layer 20 is provided on the upper layer side of the shift canceling layer 14. The cap layer 20 may be made of a material the same as or a different from that of the oxide layer 16 shown in the first embodiment.

In this embodiment as well, the oxide layer 16 containing a rare earth element, boron (B) and oxygen (O) is provided adjacent to the storage layer 11. With this structure, as in the first embodiment, Mst of the storage layer can be lowered while suppressing the increase in write current Ic and the decrease in thermal stability Δ, and the WER and ballooning of the magnetoresistance effect element can be improved.

Application Example

Figure 7:
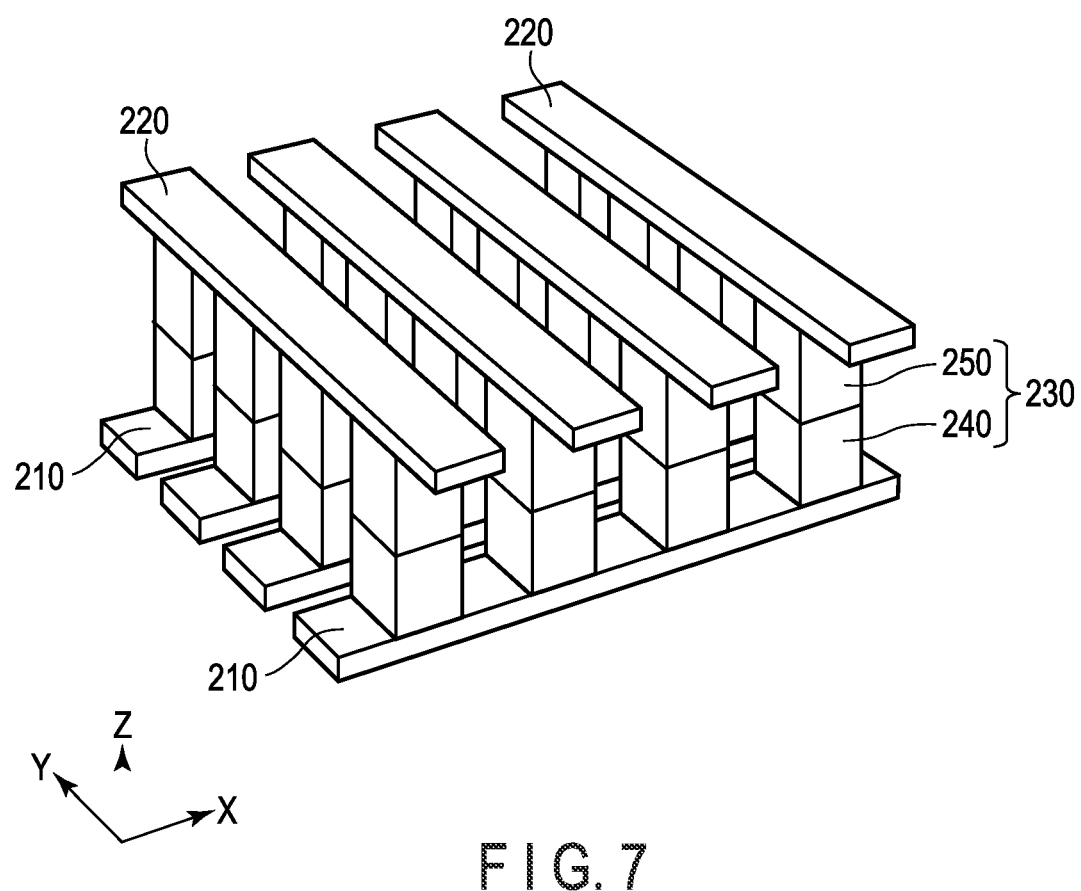
FIG. 7 is a perspective diagram schematically showing a configuration of a magnetic memory device to which the magnetoresistance effect elements shown in the first and second embodiments are applied.

FIG. 7 is a perspective diagram schematically showing a configuration of a magnetic memory device to which the magnetoresistance effect elements shown in the first or second embodiment described above is applied.

The magnetic memory device shown in FIG. 7 comprises a plurality of first wires 210 extending in the X direction, a plurality of second wires 220 extending in the Y direction intersecting the X direction, and a plurality of memory cells 230 connected respectively between the first wires 210 and the second wires 220. For example, the first wires 210 correspond to word lines and the second wires 220 correspond to bit lines, or vice versa.

Each of the memory cells 230 contains a magnetoresistance effect element 240 and a selector (switching element) 250 connected in series to the magnetoresistance effect element 240.

By applying a predetermined voltage between the first wire 210 and the second wire 220 connected to the desired memory cell 230, the selector 250 contained in the desired memory cell 230 is turned on, and thus reading or writing can be carried out with respect to the magnetoresistance effect element 240 contained in the desired memory cell 230.

Note that the magnetic memory device shown in FIG. 7 has a configuration in which the selector 250 is provided on an upper layer side of the magnetoresistance effect element 240, but it may as well be of a configuration in which the selector 250 is provided on a lower layer side of the magnetoresistance effect element 240.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory device comprising a stacked structure comprising:
    a first magnetic layer having a variable magnetization direction;
    a second magnetic layer having a fixed magnetization direction;
    a non-magnetic layer provided between the first magnetic layer and the second magnetic layer; and
    an oxide layer provided adjacent to the first magnetic layer,
    the first magnetic layer being provided between the non-magnetic layer and the oxide layer, and
    the oxide layer containing a rare earth element, boron (B), and oxygen (O),
    wherein the rare earth element is gadolinium (Gd) or yttrium (Y), and
    wherein a ratio of (i) a concentration of boron (B) contained in the oxide layer to (ii) a sum of a concentration of the gadolinium (Gd) or yttrium (Y) and the concentration of boron (B) contained in the oxide layer is 20% or higher.

2. The device of claim 1, wherein
    the first magnetic layer contains iron (Fe), cobalt (Co) and boron (B).

3. The device of claim 1, wherein
    the first magnetic layer and the second magnetic layer have perpendicular magnetization.

4. The device of claim 1, wherein
    the stacked structure further comprises a third magnetic layer canceling a magnetic field applied from the second magnetic layer to the first magnetic layer.

5. The device of claim 4, wherein
    the second magnetic layer and the third magnetic layer are antiferromagnetically coupled.

6. The device of claim 1, wherein
    the first magnetic layer is located on an upper layer side of the second magnetic layer.

7. The device of claim 1, wherein
    the first magnetic layer is located on a lower layer side of the second magnetic layer.

8. The device of claim 1, wherein
    the non-magnetic layer contains magnesium (Mg) and oxygen (O).

9. The device of claim 1, wherein
    the oxide layer is in contact with the first magnetic layer.

10. The device of claim 1, wherein
the stacked structure is included in a magnetoresistance effect element.

11. The device of claim 10, further comprising a switching element connected in series to the magnetoresistance effect element.

* * * * *